(12) United States Patent
Sekiya

(10) Patent No.: US 7,816,184 B2
(45) Date of Patent: Oct. 19, 2010

(54) MICROMACHINE DEVICE PROCESSING METHOD

(75) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/248,512

(22) Filed: Oct. 9, 2008

(65) Prior Publication Data

US 2009/0098711 A1   Apr. 16, 2009

(30) Foreign Application Priority Data

Oct. 10, 2007   (JP)   ............................... 2007-264690

(51) Int. Cl.
  *H01L 21/44*   (2006.01)
  *H01L 21/50*   (2006.01)
  *H01L 21/301*  (2006.01)

(52) U.S. Cl. .................. 438/113; 438/114; 438/107; 438/118; 438/123; 438/110; 438/464; 438/466; 438/462; 257/E21.001; 257/E21.237

(58) Field of Classification Search .................. 438/113
  See application file for complete search history.

(56) References Cited

U.S. PATENT DOCUMENTS

| | | | |
|---|---|---|---|
| 6,171,873 B1 * | 1/2001 | Mendelson et al. ............ | 438/14 |
| 7,129,110 B1 * | 10/2006 | Shibata ....................... | 438/106 |
| 2002/0068373 A1 * | 6/2002 | Lo et al. ...................... | 438/33 |
| 2005/0042844 A1 * | 2/2005 | Yee ............................ | 438/462 |
| 2005/0070074 A1 * | 3/2005 | Priewasser .................. | 438/462 |
| 2005/0139940 A1 * | 6/2005 | Patel et al. .................. | 257/414 |
| 2008/0061598 A1 * | 3/2008 | Reiman et al. ............ | 296/180.4 |
| 2008/0164573 A1 * | 7/2008 | Basker et al. ................ | 257/621 |
| 2009/0061598 A1 * | 3/2009 | Tsai et al. .................... | 438/462 |

FOREIGN PATENT DOCUMENTS

JP   2006-196588   7/2006

OTHER PUBLICATIONS

English Language Abstract of JP 2006-196588.

* cited by examiner

*Primary Examiner*—Charles D Garber
*Assistant Examiner*—Pape Sene
(74) *Attorney, Agent, or Firm*—Greenblum & Bernstein, P.L.C.

(57) ABSTRACT

A micromachine device processing method for dividing a functional wafer, which has micromachine devices formed in a plurality of regions demarcated by streets formed in a lattice pattern on a face of the functional wafer, along the streets into the individual micromachine devices, each micromachine device having a moving portion and an electrode, comprising: a cap wafer groove forming step of forming dividing grooves, which have a depth corresponding to a finished thickness of a cap wafer for protecting the face of the functional wafer, along regions in one surface of the cap wafer which correspond to areas of the electrodes of the micromachine devices; a cap wafer joining step of joining the one surface of the cap wafer subjected to the cap wafer groove forming step to the face of the functional wafer at peripheries of the moving portions; a cap wafer grinding step of grinding the other surface of the cap wafer joined to the face of the functional wafer to expose the dividing grooves to the outside; and a cutting step of cutting the functional wafer and the cap wafer subjected to the cap wafer grinding step along the streets.

3 Claims, 8 Drawing Sheets

(a)

(b)

(a)

(b)

(a)

(b)

(a)

(b)

MICROMACHINE DEVICE PROCESSING METHOD

FIELD OF THE INVENTION

This invention relates to a micromachine device processing method for dividing a wafer, which has micromachine (microelectromechanical system or MEMS) devices such as acceleration sensors formed therein, into the individual micromachine (MEMS) devices.

DESCRIPTION OF THE PRIOR ART

In a micromachine (MEMS) device manufacturing process, for example, micromachine devices such as acceleration sensors are formed in a plurality of regions demarcated by division-scheduled lines, called streets, which are formed in a lattice pattern on the face of a nearly disk-shaped semiconductor wafer, and the respective regions having the micromachine devices formed therein are divided along the streets to produce the individual micromachine devices. A cutting apparatus, called a dicing apparatus, is generally used as a dividing apparatus for dividing the semiconductor wafer having the micromachine devices formed therein. This cutting apparatus cuts the semiconductor wafer along the division-scheduled lines by a cutting blade having a thickness of the order of 40 μm.

During cutting by the cutting apparatus, however, cutting water is supplied to a portion to be cut, thus posing the problem that cutting water containing swarf enters a moving portion of the micromachine device formed in the semiconductor wafer, thereby deteriorating the quality of the micromachine device considerably. To solve this problem, JP-A-2006-196588 discloses a method which comprises sticking an ultraviolet-sensitive adhesive film to the face of the semiconductor wafer, where the micromachine devices are formed, the ultraviolet-sensitive adhesive film curing when irradiated with ultraviolet radiation; and then cutting the semiconductor wafer along the streets.

However, this method involves the following problem: After the semiconductor wafer is cut along the streets, the ultraviolet-sensitive adhesive film is peeled from the surface of each of the individual micromachine devices. In this case, the adhesive paste remains on the surface of the micromachine device to deteriorate the quality of the micromachine device. When the ultraviolet-sensitive adhesive film is peeled off, moreover, the micromachine device is damaged.

SUMMARY OF THE INVENTION

It is an object of the present invention to provide a micromachine device processing method which can divide a wafer without deteriorating the quality of micromachine devices.

According to the present invention, for attaining the above object, there is provided a micromachine device processing method for dividing a functional wafer, which has micromachine devices formed in a plurality of regions demarcated by streets formed in a lattice pattern on a face of the functional wafer, along the streets into the individual micromachine devices, each of the micromachine devices having a moving portion and an electrode connected to the moving portion, comprising:

a cap wafer groove forming step of forming dividing grooves, which have a depth corresponding to a finished thickness of a cap wafer for protecting the face of the functional wafer, along regions in one surface of the cap wafer which correspond to areas of the electrodes of the micromachine devices;

a cap wafer joining step of joining the one surface of the cap wafer subjected to the cap wafer groove forming step to the face of the functional wafer at peripheries of the moving portions;

a cap wafer grinding step of grinding other surface of the cap wafer joined to the face of the functional wafer to expose the dividing grooves to an outside; and a cutting step of cutting the functional wafer and the cap wafer subjected to the cap wafer grinding step along the streets.

A functional wafer grinding step of grinding the back of the functional wafer, to which the cap wafer has been joined, to the finished thickness of the functional wafer is performed, after or before the cap wafer grinding step is performed.

According to the present invention, the one surface of the cap wafer joined to the peripheries of the moving portions is mounted on the face of the functional wafer. Thus, even when the cutting step is performed, with cutting water being supplied to the portion to be cut, cutting water containing swarf does not enter the moving portion of the micromachine device. Moreover, the cap wafer joined to the face of the functional wafer is cut in the above cutting step and, after division into the individual micromachine devices, the cut cap wafer functions as the cap. This obviates the necessity of peeling off the cut cap wafer. That is, after division into the individual micromachine devices, there is no need to peel off the cap wafer, as done for an ultraviolet-sensitive adhesive film stuck to the face of the functional wafer for protecting the conventional micromachine device. Thus, it is not that the adhesive paste remains on the surface of the micromachine device to deteriorate the quality of the micromachine device. Besides, the problem that when the ultraviolet-sensitive adhesive film is peeled off, the micromachine device is damaged can be solved. Furthermore, the dividing grooves of a depth corresponding to the finished thickness of the cap wafer are formed in the one surface of the cap wafer, which is joined to the face of the functional wafer, along the regions corresponding to the areas of the electrodes of the micromachine devices. These dividing grooves are exposed at the other surface of the cap wafer by grinding the other surface of the cap wafer. By cutting the functional wafer and the cap wafer along the streets, therefore, the regions in the cap wafer which cover the electrodes can be removed to expose the electrodes.

DETAILED DESCRIPTION OF THE PREFERRED EMBODIMENTS

Preferred embodiments of the micromachine device processing method according to the present invention will be described in detail by reference to the accompanying drawings.

Figure 1:
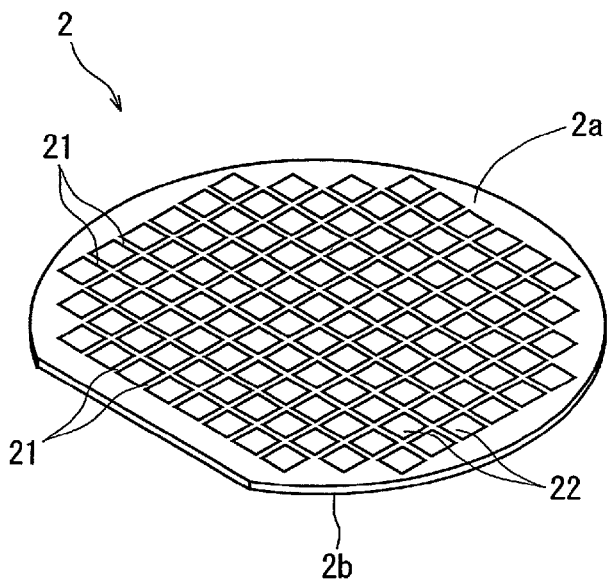
FIG. 1 is a perspective view of a functional wafer having a plurality of micromachine devices formed therein.
Figure 2:
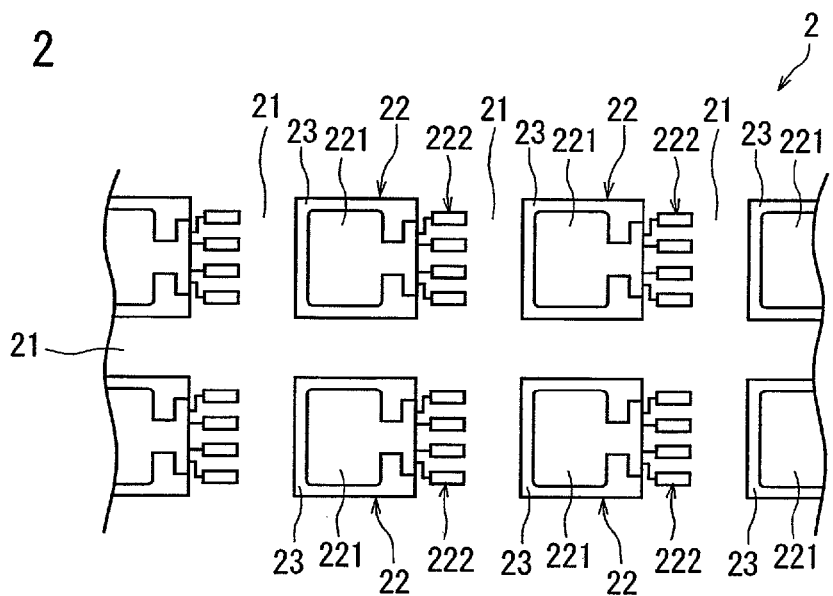
FIG. 2 is a plan view showing, on a partly enlarged scale, the functional wafer shown in FIG. 1.
Figure 3:
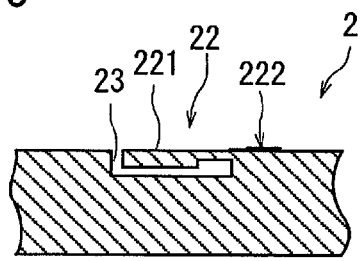
FIG. 3 is a sectional view showing, on a partly enlarged scale, the functional wafer shown in FIG. 1.

FIG. 1 shows a perspective view of a functional wafer having a plurality of micromachine devices formed therein. A functional wafer 2 shown in FIG. 1, for example, comprises a silicon wafer having a thickness of 700 μm, and has a plurality of streets 21 formed in a lattice pattern on the face 2a of the functional wafer 2. On the face 2a of the functional wafer 2, micromachine devices 22 each having a moving portion 221 and an electrode 222 connected to the moving portion 221 are formed in a plurality of regions demarcated by the plurality of streets 21 formed in the lattice pattern, as shown in FIG. 2. The functional wafer 2 in the illustrated embodiment has concavities 23 formed by etching in the surfaces of the regions demarcated by the plurality of streets 21, and has the moving portions 221 provided in these concavities 23, as shown in FIGS. 2 and 3.

A micromachine device processing method, in which the above-mentioned functional wafer 2 having the plurality of micromachine devices 22 formed therein is cut along the plurality of streets 21 and thereby divided into the individual micromachine devices 22, will be described below.

Figure 4:
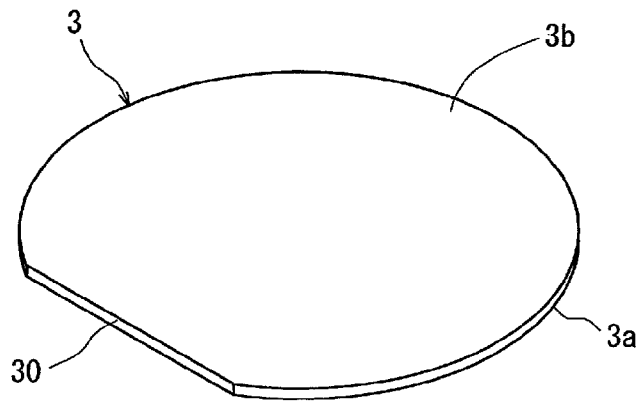
FIG. 4 is a perspective view of a cap wafer to be joined to the face of the functional wafer shown in FIG. 1.
Figure 5:
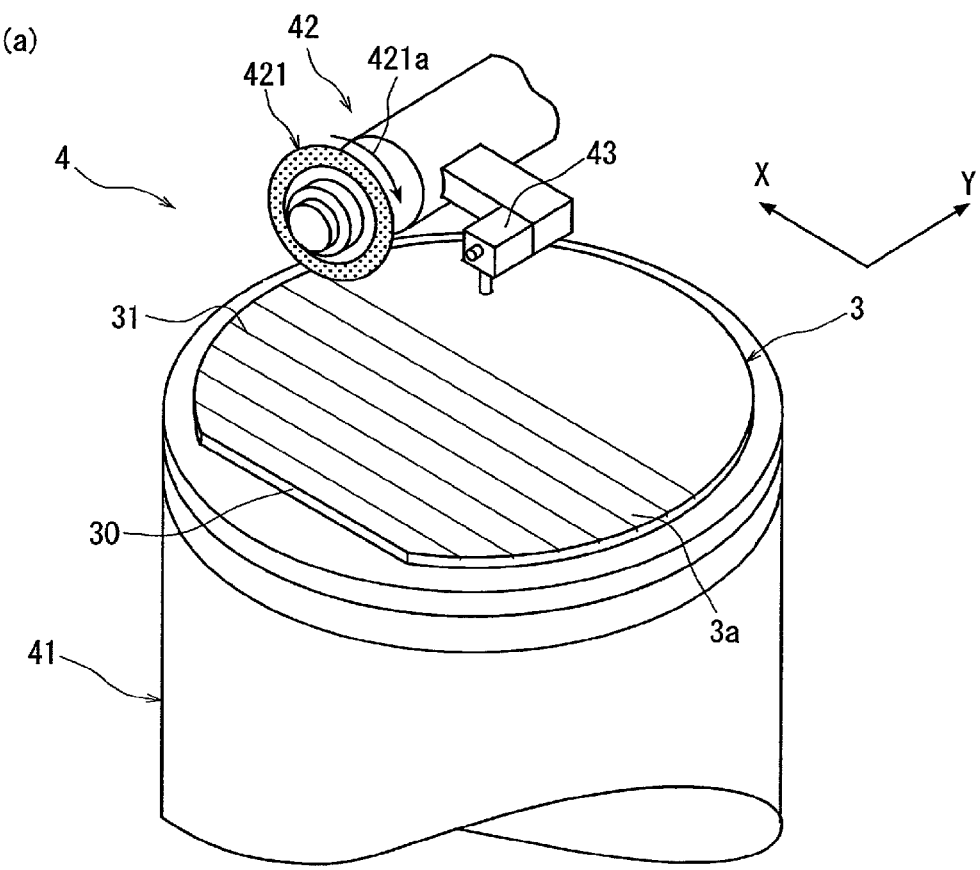
FIGS. 5(a) and 5(b) are illustrations of a cap wafer groove forming step in a micromachine device processing method according to the present invention.
Figure 5:
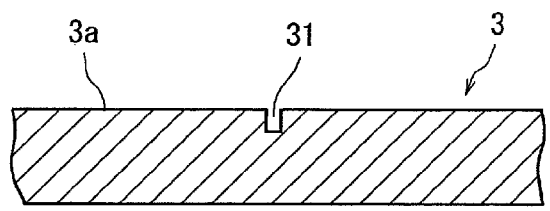

First of all, a cap wafer for protecting the face 2a of the functional wafer 2 is produced. As shown in FIG. 4, a cap wafer 3 comprises a silicon wafer formed in the same shape as that of the functional wafer 2. On one surface 3a of the cap wafer 3, dividing grooves 31 of a depth corresponding to the finished thickness of the cap wafer 3 are formed along regions corresponding to the areas of the electrodes 222 (in the illustrated embodiment, the base part of the electrode 222 (facing the moving portion 221)) of the micromachine devices 22 formed in the functional wafer 2. A step performed for this purpose is a cap wafer groove forming step. This cap wafer groove forming step is performed using a cutting apparatus 4 shown in FIG. 5(a). The cutting apparatus 4 shown in FIG. 5(a) is furnished with a chuck table 41 for suction-holding a workpiece, a cutting means 42 provided with a cutting blade 421 for cutting the workpiece held on the chuck table 41, and an imaging means 43 for forming an image of the workpiece held on the chuck table 41. The chuck table 41 is adapted to suction-hold the workpiece, and is movable by a moving mechanism (not shown) in a processing feed direction indicated by an arrow X (X-axis direction) in FIG. 5(a), and in an indexing feed direction indicated by an arrow Y (Y-axis direction) orthogonal to the processing feed direction. The imaging means 43 is constituted of optical means such as a microscope and a CCD camera, and transfer an image signal acquired by image formation to a control means (not shown).

To carry out the cap wafer groove forming step using the so constructed cutting apparatus 4, the cap wafer 3 is placed on the chuck table 41, with the one surface 3a of the cap wafer 3 being pointed upward. Then, a suction means (not shown) is actuated to hold the cap wafer 3 on the chuck table 41. The chuck table 41 suction-holding the cap wafer 3 in this manner is positioned directly below the imaging means 43 by a cutting feed mechanism (not shown).

When the chuck table 41 is positioned directly below the imaging means 43, an alignment step is performed for positioning the cap wafer 3 held on the chuck table 41 to a predetermined position by the imaging means 43 and the control means (not shown). That is, the imaging means 43 and the control means (not shown) confirm whether an orientation flat 30 formed in the cap wafer 3 is positioned parallel to the X-axis direction. If the orientation flat 30 is not positioned parallel to the X-axis direction, the chuck table 41 is turned to bring the orientation flat 30 to a position where it becomes parallel to the X-axis direction. Here, an example is shown in which the above alignment step is performed, with the orientation flat 30 formed in the cap wafer 3 being used as a reference. However, on the one surface of the cap wafer 3, dividing groove forming lines may be provided in regions corresponding to the areas of the electrodes 222 of the micromachine devices 22 formed in the functional wafer 2, and the alignment step may be performed by forming an image of the dividing groove forming line by the imaging means 43.

After the above-mentioned alignment work is done, the chuck table 41 is operated, based on the design values being stored in the control means (not shown) with reference to the orientation flat 30 of the functional wafer 2, or based on the above dividing groove forming lines, whereby the region in the cap wafer 3 corresponding to the base part of the electrode 222 (facing the moving portion 221) of the micromachine device 22 formed in the functional wafer 2 is moved to a cutting start position directly below the cutting blade 421. The cutting blade 421 is moved downward while being rotated in a direction indicated by an arrow 421a in FIG. 5(a) to carry out infeeding in a predetermined amount. The position of this infeeding is set such that the outer peripheral edge of the cutting blade 421 comes from the one surface 3a of the cap wafer 3 downward to a depth position (e.g., 150 μm) corresponding to the finished thickness of the cap wafer 3. After the infeeding of the cutting blade 421 is performed in this manner, the chuck table 41 is cutting-fed in the direction indicated by the arrow X in FIG. 5(a), with the cutting blade 421 being rotated. As a result, a dividing groove 31 having a depth (e.g., 150 μm) corresponding to the finished thickness of the cap wafer 3 is formed, as shown in FIG. 5(b). This cap wafer groove forming step is performed for all the regions in the cap wafer 3 corresponding to the base parts of the electrodes 222 (facing the moving portions 221) of the micromachine devices 22 formed in the functional wafer 2.

Figure 6:
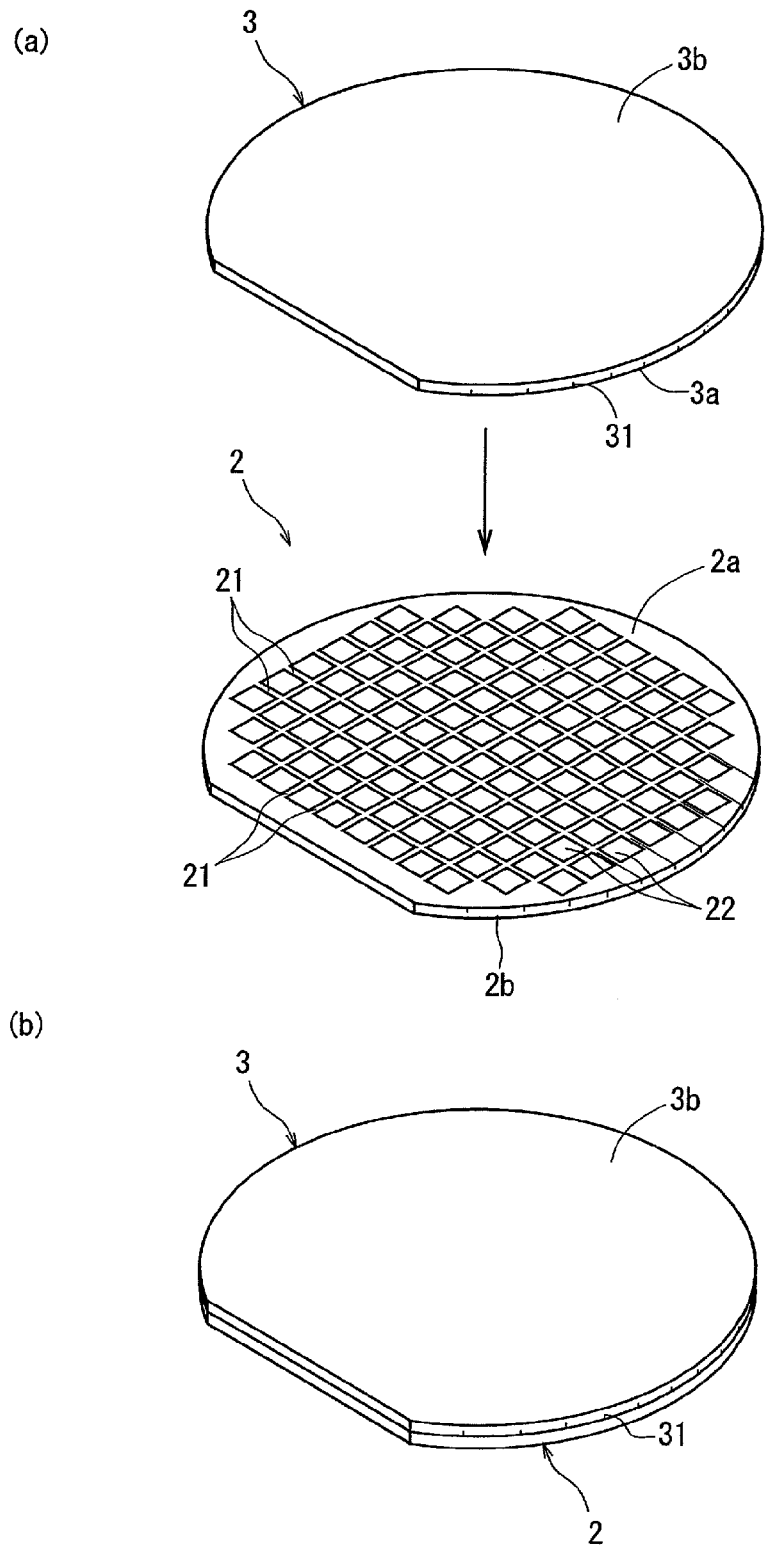
FIGS. 6(a) and 6(b) are illustrations of a cap wafer joining step in the micromachine device processing method according to the present invention.
Figure 7:
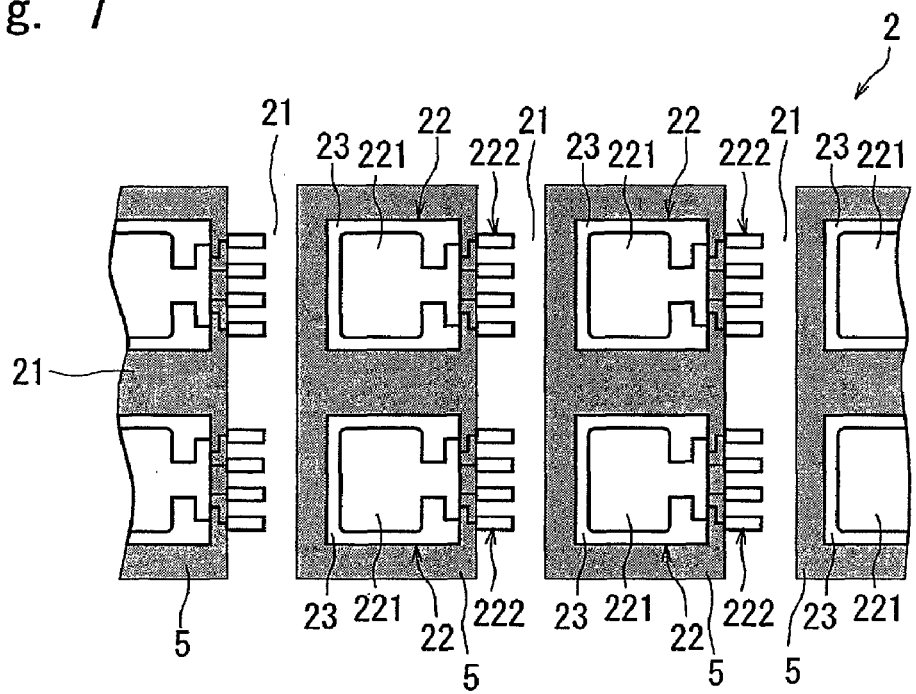
FIG. 7 is an explanatory drawing showing regions coated with an adhesive in the cap wafer joining step shown in FIGS. 6(a) and 6(b).
Figure 8:
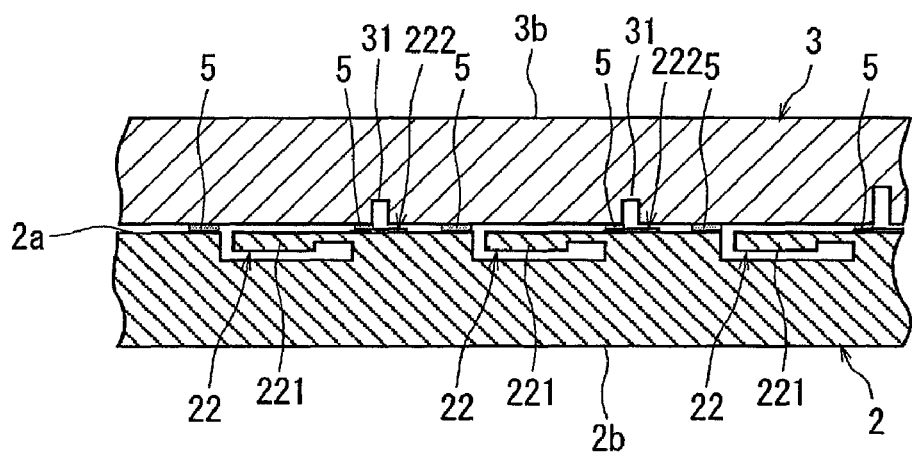
FIG. 8 is an enlarged sectional view of essential parts showing a state where the cap wafer joining step shown in FIGS. 6(a) and 6(b) was performed to join the cap wafer to the face of the functional wafer.

After the above-described cap wafer groove forming step is carried out, a cap wafer joining step is performed in which the one surface 3a of the cap wafer 3 (the surface where the dividing grooves 31 have been formed) is joined to the face 2a of the functional wafer 2, as shown in FIGS. 6(a) and 6(b). On this occasion, the face 2a of the functional wafer 2 and the one surface 3a of the cap wafer 3 are joined by an adhesive 5 at the peripheries of the moving portions 221 of the micromachine devices 22, as shown in FIG. 7. When the one surface 3a of the cap wafer 3 is joined to the face 2a of the functional wafer 2 in this manner, the dividing grooves 31 formed in the one surface 3a of the cap wafer 3 are positioned to oppose the base parts of the electrodes 222 (facing the moving portions 221) of the micromachine devices 22, as shown in FIG. 8. The cap wafer joining step of joining the one surface 3a of the cap wafer 3 to the face 2a of the functional wafer 2 can also be performed by anodic bonding.

Figure 9:
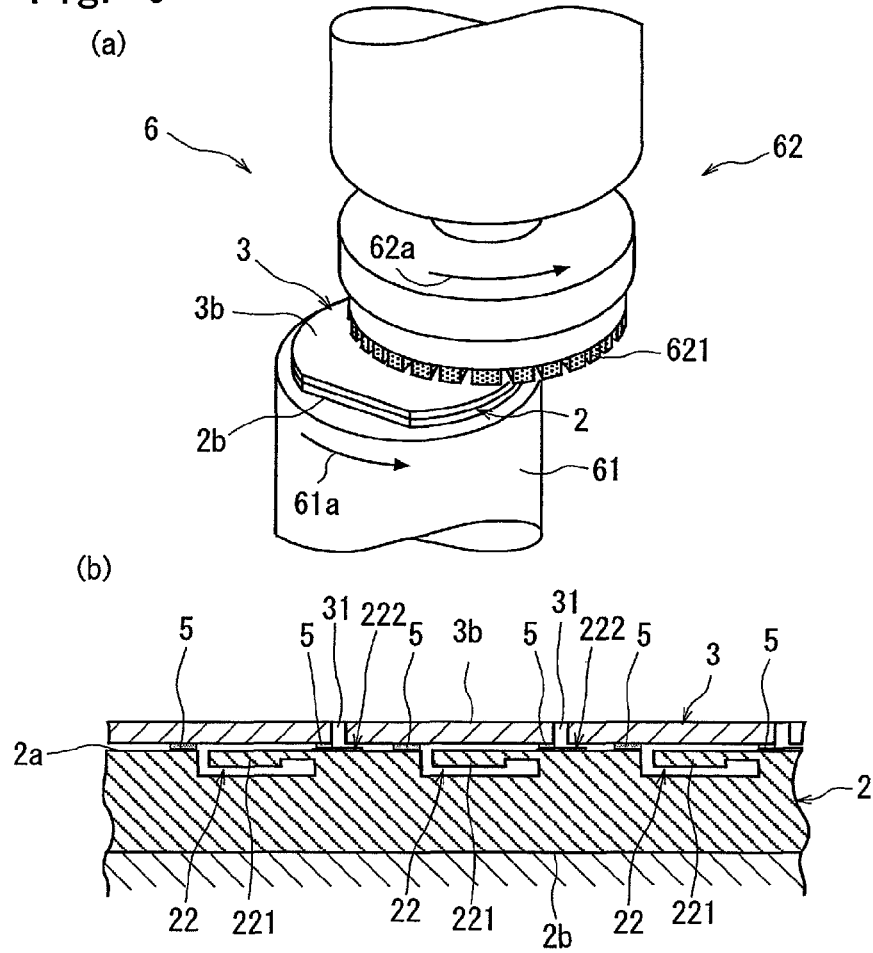
FIGS. 9(a) and 9(b) are illustrations of a cap wafer grinding step in the micromachine device processing method according to the present invention.

After the above cap wafer joining step is performed, a cap wafer grinding step is performed in which the other surface 3b of the cap wafer 3 joined to the face 2a of the functional wafer 2 is ground to expose the dividing grooves 31 to the outside. This cap wafer grinding step is carried out using a grinding apparatus 6 shown in FIG. 9(a). The grinding apparatus 6 shown in FIG. 9(a) comprises a chuck table 61 for suction-holding a workpiece, and a grinding means 62 equipped with a grinding wheel 621 for grinding the workpiece held by the chuck table 61. To carry out the cap wafer grinding step by the grinding apparatus 6 configured in this manner, the back 2b of the functional wafer 2 joined to the cap wafer 3 is placed on the chuck table 61, and suction-held onto the chuck table 61. Thus, the other surface 3b of the cap wafer 3 joined to the functional wafer 2 is pointed upward. In holding the back 2b of the functional wafer 2 on the chuck table 61, it is desirable to stick a protective tape to the back 2b of the functional wafer 2. After the back 2b of the functional wafer 2 having the cap wafer 3 joined thereto is suction-held onto the chuck table 61 in this manner, the chuck table 61 is rotated at 300 rpm in a direction indicated by an arrow 61a, for example. During this process, the grinding wheel 621 of the grinding means 62 is rotated at 6000 rpm in a direction indicated by an arrow 62a, and brought into contact with the other surface 3b of the cap wafer 3. By so doing, the other surface 3b of the cap wafer 3 is ground to the finished thickness of the cap wafer 3 (e.g., 150 μm). As a result, the dividing grooves 31 appear at the other surface 3b, as shown in FIG. 9(b).

Figure 10:
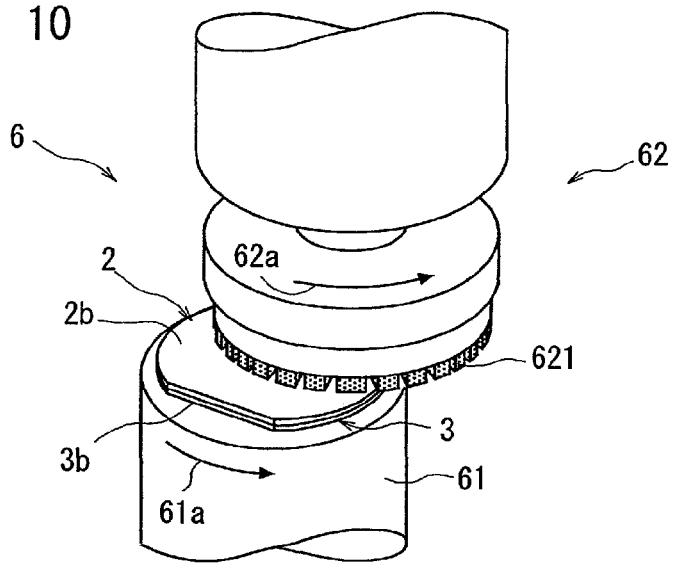
FIG. 10 is an illustration of a functional wafer grinding step in the micromachine device processing method according to the present invention.

After the above-mentioned cap wafer grinding step is performed, or before the cap wafer grinding step is carried out, a functional wafer grinding step is performed in which the back 2b of the functional wafer 2 having the cap wafer 3 joined thereto is ground to the finished thickness of the functional wafer 2. This functional wafer grinding step can be performed using the grinding apparatus 6 shown in FIG. 9(a). That is, the other surface 3b of the cap wafer 3 joined to the face 2a of the functional wafer 2 is placed on the chuck table 61, and suction-held onto the chuck table 61, as shown in FIG. 10. Thus, the functional wafer 2, to which the cap wafer 3 has been joined, has the back 2b pointed upward. In holding the other surface 3b of the cap wafer 3 joined to the face 2a of the functional wafer 2 on the chuck table 61, it is desirable to stick a protective tape to the other surface 3b of the cap wafer 3. After the other surface 3b of the cap wafer 3 joined to the face 2a of the functional wafer 2 is suction-held onto the chuck table 61 in this manner, the chuck table 61 is rotated at 300 rpm in a direction indicated by an arrow 61a, for example. During this process, the grinding wheel 621 of the grinding means 62 is rotated at 6000 rpm in a direction indicated by an arrow 62a, and brought into contact with the back 2b of the functional wafer 2. By so doing, the back 2b of the functional wafer 2 is ground to the finished thickness of the functional wafer 2 (e.g., 150 μm).

Figure 11:
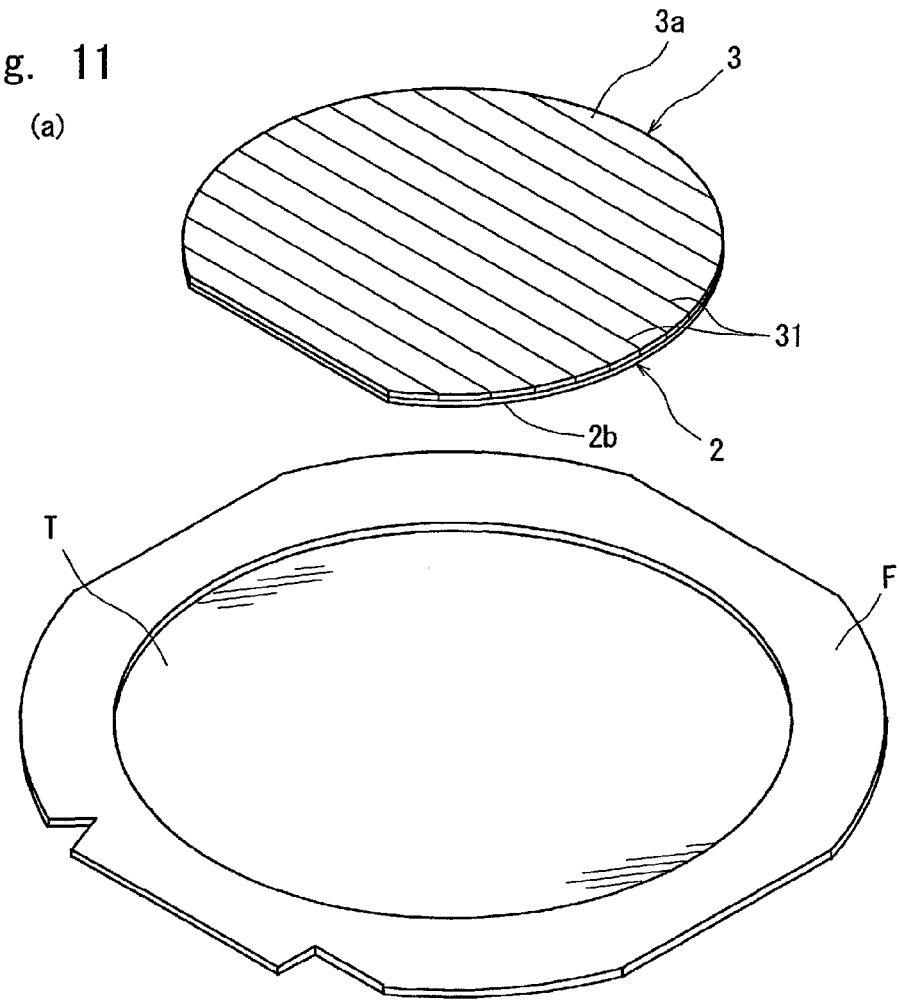
FIGS. 11(a) and 11(b) are illustrations of a wafer supporting step in the micromachine device processing method according to the present invention.
Figure 11:
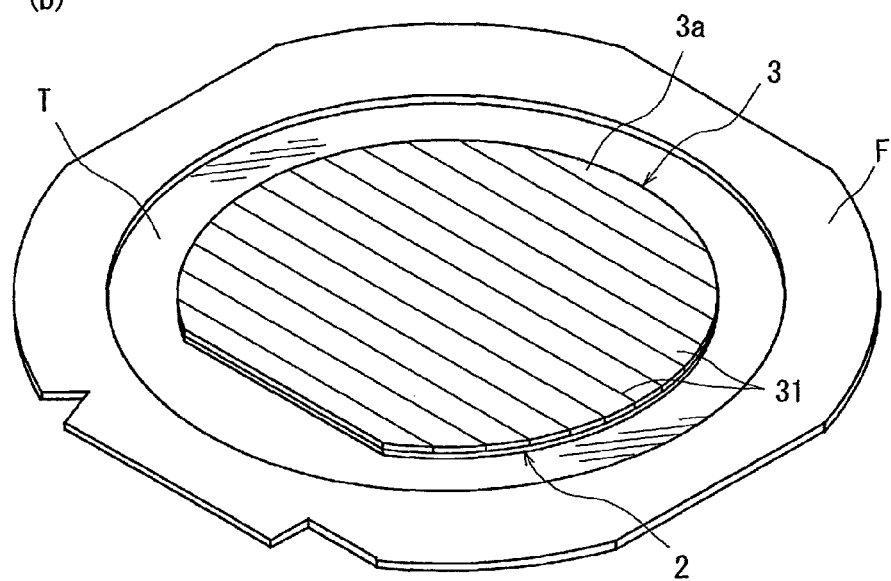

After the cap wafer grinding step and the functional wafer grinding step described above are performed, a cutting step is performed for cutting the functional wafer 2 and the cap wafer 3 along the streets 21. This cutting step can be performed using the aforementioned cutting apparatus 4 shown in FIG. 5. In performing the cutting step using the cutting apparatus 4, the back 2b of the functional wafer 2 having the cap wafer 3 joined thereto, which was subjected to the cap wafer grinding step and the functional wafer grinding step mentioned above, is stuck to the surface of a dicing tape T having an outer peripheral portion mounted on an annular frame F so as to cover its inner opening (a wafer supporting step), as shown in FIGS. 11(a) and 11(b).

After the above wafer supporting step is carried out, the dicing tape T, to which the functional wafer 2 having the cap wafer 3 joined thereto has been stuck, is placed on the chuck table 41 of the cutting apparatus 4, as shown in FIG. 12(a). Then, the suction means (not shown) is actuated to suction-hold the functional wafer 2 having the cap wafer 3 joined thereto onto the chuck table 41 via the dicing tape T. In FIG. 12(a), the annular frame F on which the dicing tape T has been mounted is omitted, but the annular frame F is fixed by a suitable frame fixing clamp disposed on the chuck table 41. The chuck table 41, which has suction-held the functional wafer 2 having the cap wafer 3 joined thereto via the dicing tape T in this manner, is positioned directly below the imaging means 43 by the cutting feed mechanism (not shown).

When the chuck table 41 is positioned directly below the imaging means 43, an alignment step is performed for detecting a region of the functional wafer 2 to be cut in the functional wafer 2 having the cap wafer 3 joined thereto by the imaging means 43 and the control means (not shown). That is, the imaging means 43 and the control means (not shown) execute image processing, such as pattern matching, for aligning the street 21 of the functional wafer 2 formed in a predetermined direction with the cutting blade 421, and carry out the alignment of a region to be cut (an alignment step). Similarly, the alignment of the region to be cut by the cutting blade 421 is performed also for the street 21 formed in the functional wafer 2 which extends perpendicularly to the above predetermined direction. At this time, the cap wafer 3 has been joined to the face 2a of the functional wafer 2. However, an imaging means composed of an infrared illumination means, an optical system catching infrared radiation, and an imaging device (infrared CCD) for outputting an electrical signal corresponding to the infrared radiation is used as the imaging means 43, so that the imaging means 43 can form an image of the street 21 through the cap wafer 3.

In the above manner, the street 21 formed in the functional wafer 2 held on the chuck table 41 is detected, and the alignment of the region to be cut is performed. Then, the chuck table 41 holding the functional wafer 2 having the cap wafer 3 joined thereto is moved to a cutting start position in the region to be cut. The cutting blade 421 is rotated at a predetermined rotational speed in a direction indicated by an arrow 421a in FIG. 12(a), is downwardly infed by an infeeding mechanism (not shown), and is brought to an infeeding position where the lower end of the outer peripheral edge of the cutting blade 421 reaches the dicing tape T, as shown in FIG. 12(b).

Figure 12:
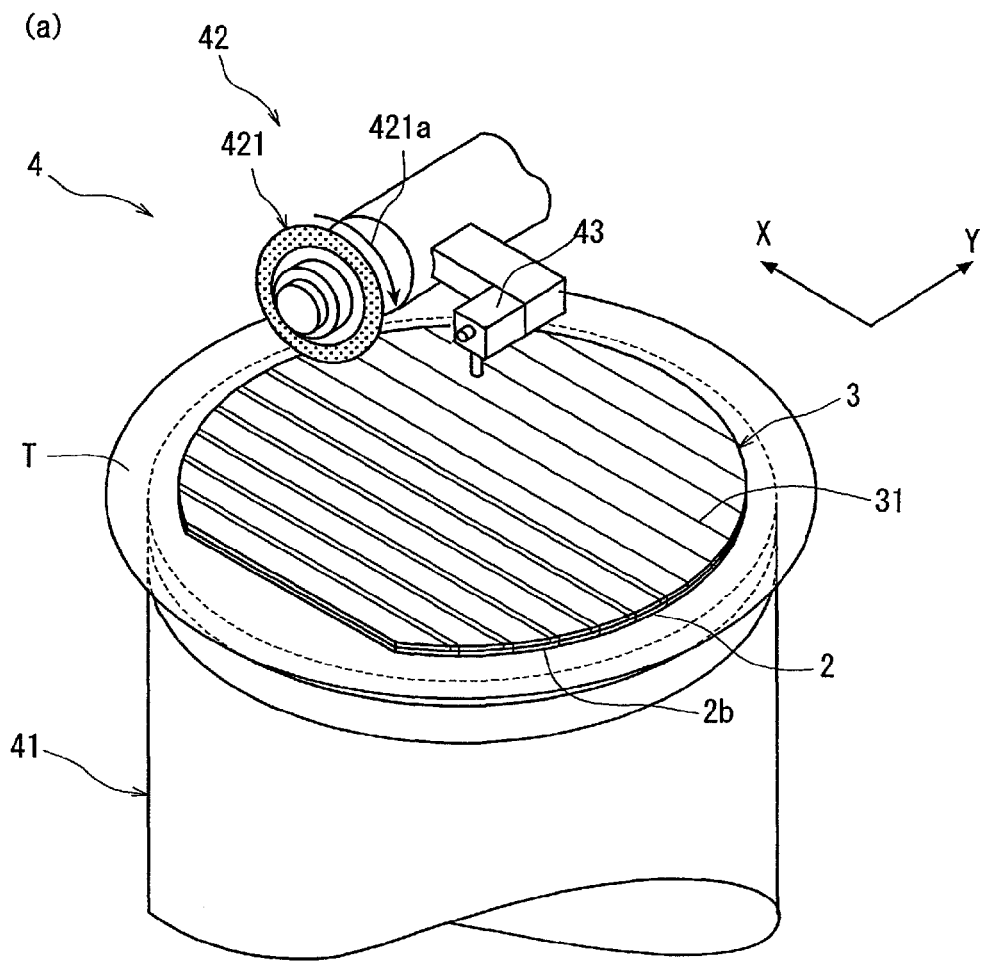
FIGS. 12(a) and 12(b) are illustrations of a cutting step in the micromachine device processing method according to the present invention.
Figure 12:
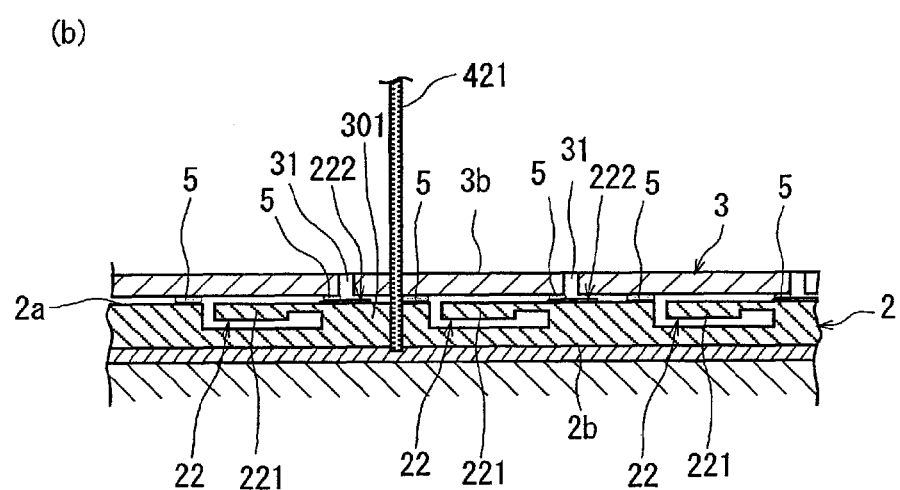
Figure 13:
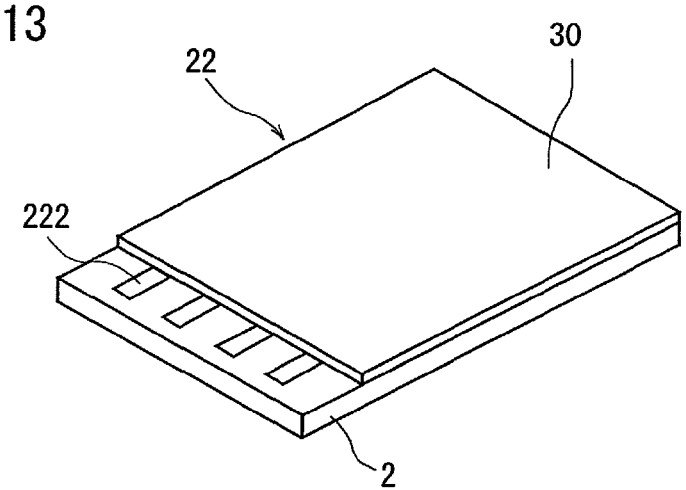
FIG. 13 is a perspective view of the micromachine device divided by the micromachine device processing method according to the present invention.

After the infeeding of the cutting blade 421 is carried out in the above manner, the chuck table 41 is processing-fed in a direction indicated by an arrow X in FIG. 12(a), while the cutting blade 421 is being rotated at a predetermined rotational speed in the direction indicated by the arrow 421*a* in FIG. 12(*a*). As a result, the functional wafer 2 having the cap wafer 3 joined thereto is cut along the street 21 (a cutting step). This cutting step is performed along all the streets 21 formed in the functional wafer 2, whereby the micromachine devices 22 are obtained in the functional wafer 2 to whose face a cap 30 is joined, as shown in FIG. 13. By cutting the cap wafer 3 and the functional wafer 2 along the street 21 formed in the functional wafer 2 as described above, a portion 301 in the cap wafer 3 covering the electrode 222 (see FIG. 12(*b*)) is removed, because the dividing groove 31 has been formed. Consequently, the electrode 222 is exposed to the outside, as shown in FIG. 13.

The above-described cutting step is performed, with cutting water being supplied to the portion to be cut. Since the cap wafer 3 is joined to the face of the functional wafer 2, however, cutting water containing swarf does not enter the moving portion 221 of the micromachine device 22. Moreover, the cap wafer 3 joined to the face of the functional wafer 2 is cut in the above cutting step and, after division into the individual micromachine devices 22, the cut cap wafer 3 functions as the cap 30, as shown in FIG. 13. This obviates the necessity of peeling off the cut cap wafer 3. That is, after division into the individual micromachine devices, there is no need to peel off the cap wafer, as done for a ultraviolet-sensitive adhesive film stuck to the face of the functional wafer for protecting the conventional micromachine device. Thus, it is not that the adhesive paste remains on the surface of the micromachine device to deteriorate the quality of the micromachine device. Besides, the problem that when the ultraviolet-sensitive adhesive film is peeled off, the micromachine device is damaged can be solved.

Figure 14:
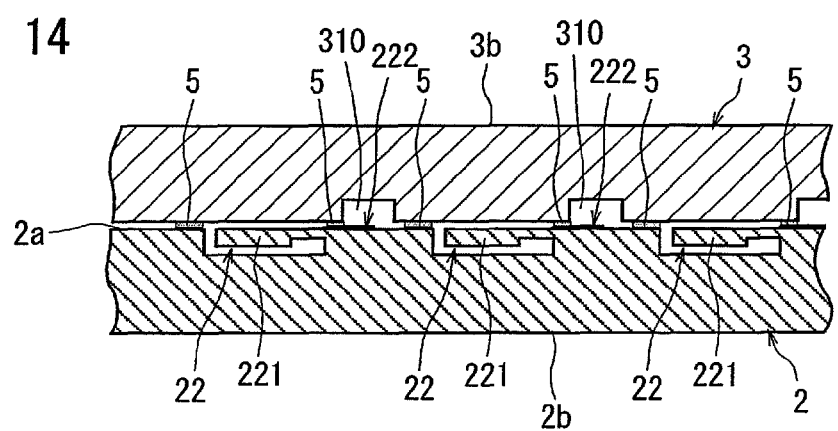
FIG. 14 is an enlarged sectional view of essential parts showing a state where the cap wafer subjected to another embodiment of the cap wafer groove forming step in the micromachine device processing method according to the present invention has been joined to the face of the functional wafer.
Figure 15:
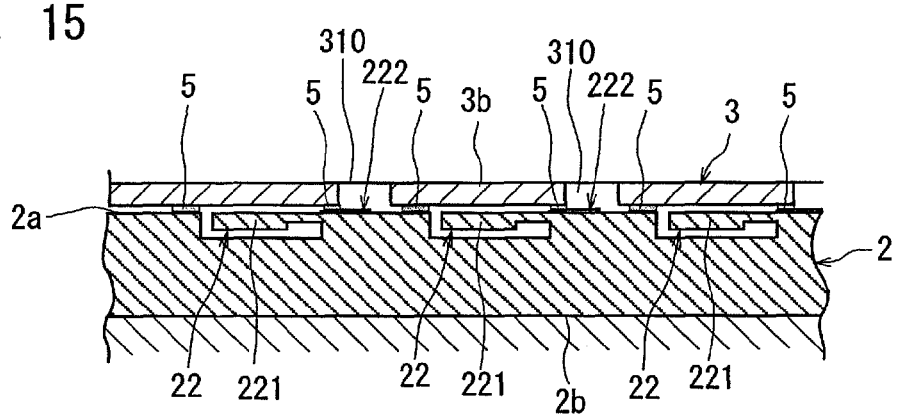
FIG. 15 is an enlarged sectional view of essential parts showing a state where the cap wafer joined to the face of the functional wafer shown in FIG. 14 has been subjected to the cap wafer grinding step.

Next, another embodiment of the cap wafer groove forming step of forming the dividing grooves of the depth corresponding to the finished thickness of the cap wafer 3 along the regions corresponding to the areas of the electrodes 222 of the micromachine devices 22 formed in the functional wafer 2 will be described by reference to FIG. 14. The aforementioned embodiment shows an example in which the dividing grooves 31 are formed in the regions in the cap wafer 3 corresponding to the base parts of the electrodes 222 (facing the moving portions 221). In the embodiment shown in FIG. 14, on the other hand, a cutting blade of a large width is used to form a dividing groove 310 of a large groove width, thereby allowing the dividing groove 310 to oppose most of the region of the electrode 222. By forming the dividing groove 310 in such a width, the execution of the aforementioned cap wafer grinding step results in the exposure of the electrode 222, as shown in FIG. 15. Thus, there occurs no fractional material such as the portion 301 in the cap wafer 3 covering the electrode 222 as shown in FIG. 14.

While the preferred embodiments of the present invention have been described in detail by reference to the accompanying drawings, it is to be understood that the invention is not limited to such embodiments, but various changes and modifications may be made without departing from the scope of the present invention.

What is claimed is:

1. A micromachine device processing method for dividing a functional wafer, which has micromachine devices formed in a plurality of regions demarcated by streets formed in a lattice pattern on a face of the functional wafer, along the streets into the individual micromachine devices, each of the micromachine devices having a moving portion and an electrode connected to the moving portion, comprising:

a cap wafer groove forming step of forming dividing grooves, which have a depth corresponding to a finished thickness of a cap wafer for protecting the face of the functional wafer, along regions in one surface of the cap wafer which correspond to areas of the electrodes of the micromachine devices;

a cap wafer joining step of joining the one surface of the cap wafer subjected to the cap wafer groove forming step to the face of the functional wafer at locations peripheral to the moving portions;

a cap wafer grinding step of grinding another surface of the cap wafer joined to the face of the functional wafer to expose the dividing grooves to an outside; and a cutting step of cutting the functional wafer after the cap wafer joining step, wherein, in the cap wafer joining step, the locations peripheral to the moving portions are joined to the cap wafer and portions of the locations peripheral to the moving portions are not joined to the cap wafer, wherein, in the cap wafer grinding step, the portions of the locations peripheral to the moving portions not joined to the cap wafer are removed, and wherein, after the portions of the locations peripheral to the moving portions are removed in the cap wafer grinding step, the dividing grooves are exposed to the outside in a manner which exposes areas of the electrodes to the outside.

2. The micromachine device processing method according to claim 1, further comprising a functional wafer grinding step of grinding a back of the functional wafer, to which the cap wafer has been joined, to a finished thickness of the functional wafer, after performing the cap wafer grinding step.

3. The micromachine device processing method according to claim 1, further comprising a functional wafer grinding step of grinding a back of the functional wafer, to which the cap wafer has been joined, to a finished thickness of the functional wafer, before performing the cap wafer grinding step.

* * * * *